(12) United States Patent
Hsu et al.

(10) Patent No.: US 8,754,328 B2
(45) Date of Patent: Jun. 17, 2014

(54) LAMINATE CIRCUIT BOARD WITH A MULTI-LAYER CIRCUIT STRUCTURE

(71) Applicant: Kinsus Interconnect Technology Corp., Taoyuan (TW)

(72) Inventors: Jun-Chung Hsu, Taoyuan County (TW); Chi-Ming Lin, Taipei (TW); Tso-Hung Yeh, New Taipei (TW); Ya-Hsiang Chen, Yunlin County (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 0 days.

(21) Appl. No.: 13/663,141

(22) Filed: Oct. 29, 2012

(65) Prior Publication Data

US 2013/0224513 A1    Aug. 29, 2013

(30) Foreign Application Priority Data

Feb. 29, 2012 (TW) .............................. 101106506 A

(51) Int. Cl.
*H02G 15/00* (2006.01)
*H05K 1/11* (2006.01)

(52) U.S. Cl.
USPC .......... 174/73.1; 174/250; 174/261; 174/264; 361/771; 361/792; 361/803

(58) Field of Classification Search
USPC ......... 428/209; 174/250–255, 73.1, 261, 264; 361/771, 792, 803
See application file for complete search history.

(56) References Cited

U.S. PATENT DOCUMENTS

| | | | |
|---|---|---|---|
| 3,269,861 A * | 8/1966 | Schneble, Jr. et al. | 216/18 |
| 6,117,784 A * | 9/2000 | Uzoh | 438/694 |
| 6,265,075 B1 * | 7/2001 | Klueppel et al. | 428/418 |
| 6,467,160 B1 * | 10/2002 | Cummings et al. | 29/831 |
| 6,504,111 B2 * | 1/2003 | Curcio et al. | 174/264 |
| 6,812,412 B2 * | 11/2004 | Obata et al. | 174/261 |
| 7,662,662 B2 * | 2/2010 | Hsu et al. | 438/106 |
| 7,805,834 B2 * | 10/2010 | White et al. | 29/830 |
| 7,805,835 B2 * | 10/2010 | Dai et al. | 29/843 |
| 8,377,815 B2 * | 2/2013 | Chang et al. | 438/612 |
| 2006/0289203 A1 * | 12/2006 | Oda | 174/264 |
| 2008/0036079 A1 * | 2/2008 | Chen et al. | 257/737 |

* cited by examiner

*Primary Examiner* — Cathy Lam
(74) *Attorney, Agent, or Firm* — Lin & Associates IP, Inc.

(57) ABSTRACT

A laminate circuit board with a multi-layer circuit structure which includes a substrate, a first circuit metal layer, a second circuit metal layer, a first nanometer plating layer, a second nanometer plating layer and a cover layer is disclosed. The first circuit metal layer is embedded in the substrate or formed on at least one surface of the substrate which is smooth. The first nanometer plating layer with a smooth surface covers the first circuit metal layer. The second nanometer plating layer is formed on the other surface of the substrate and fills up the opening in the cover layer to electrically connect the first circuit metal layer. The junction adhesion is improved by the chemical bonding between the nanometer plating layer and the cover layer/the substrate. Therefore, the circuit metal layer does not need to be roughened and the density of the circuit increases.

14 Claims, 5 Drawing Sheets

LAMINATE CIRCUIT BOARD WITH A MULTI-LAYER CIRCUIT STRUCTURE

CROSS-REFERENCE TO RELATED APPLICATION

This application claims the priority of Taiwanese patent application No. 101106506, filed on Feb. 29, 2012, which is incorporated herewith by reference.

BACKGROUND OF THE INVENTION

1. Field of the Invention

The present invention generally relates to a laminate circuit board with a multi-layer circuit structure, and more specifically to a nanometer plating layer over a metal circuit layer without reserving circuit width for compensation.

2. The Prior Arts

Please refer to FIG. 1. The laminate circuit board with the multi-layer circuit structure in the prior arts generally comprises a substrate 10, a circuit metal layer 25 and a cover layer 30, as shown in FIG. 1. The substrate 10 has a rough upper surface 15, on which the circuit metal layer 25 made of at least one of copper, aluminum, silver and gold is formed. The cover layer 30 made of a binder or a solder resist is formed to cover the circuit metal layer 25. Since the circuit metal layer 25 and cover layer 30 are made of different materials, the outer surface of the circuit metal layer 25 needs to be roughened to form a roughened outer surface 27 by chemical, mechanical or plasma treatment so as to increase the surface friction coefficient and avoid peeling off. Thus, the junction property is improved by the roughened outer surface 27.

However, one of the shortcomings of the circuit metal layer 25 with the roughened outer surface 27 in the prior arts is that it is necessary to reserve some circuit width to compensate the loss due to the roughening process, and the design of the circuit is thus greatly constrained, especially for much denser circuit in the current application. Therefore, it needs a laminate circuit board with a multi-layer circuit structure with reduced compensation for circuit width to increase the density of the circuit.

SUMMARY OF THE INVENTION

A primary objective of the present invention is to provide a laminate circuit board with a multi-layer circuit structure. The laminate circuit board of the present invention comprises a substrate, a first circuit metal layer, a second circuit metal layer, a first nanometer plating layer, a second nanometer plating layer and a cover layer. One of the upper and lower surfaces of the substrate is a smooth surface. The first circuit metal layer is formed on the lower surface of the substrate, and the first nanometer plating layer covers the first circuit metal layer. The second circuit metal layer is formed on the upper surface of the substrate and the second nanometer plating layer covers the second circuit metal layer. The cover layer is formed on the substrate to cover the first nanometer plating layer on the first circuit metal layer and the second nanometer plating layer on the second circuit metal layer. Each of the first circuit metal layer, the second circuit metal layer, the first nanometer plating layer and the second nanometer plating layer has a smooth surface which has a roughness defined by Ra<0.35 µm and Rz<3 µm and not recognizable by cross-sectional examination through an optical microscope of 1,000 magnifications.

Another objective of the present invention is to provide a laminate circuit board with a multi-layer circuit structure. The laminate circuit board of the present invention method comprises a substrate, a first circuit metal layer, a first nanometer plating layer, a cover layer, a third circuit metal layer, a third nanometer plating layer and a second cover layer. The substrate has a smooth surface on which the first circuit metal layer is formed. The first nanometer plating layer covers the first circuit metal layer and the second nanometer plating layer covers the second circuit metal layer. The first cover layer is formed on the substrate to cover the substrate and the first nanometer plating layer on the first circuit metal layer as well as the second nanometer plating layer on the second circuit metal layer. The third circuit metal layer is formed on the first cover layer and fills up at least one opening in the first cover layer with respect to the first circuit metal layer so as to electrically connect the first circuit metal layer. The third nanometer plating layer covers the third circuit metal layer. The second cover layer is formed on the first cover layer to cover the third nanometer plating layer which covers the third circuit metal layer. Each of the first circuit metal layer, the third circuit metal layer, the first nanometer plating layer and the third nanometer plating layer has a smooth surface which has a roughness defined by Ra<0.35 µm and Rz<3 µm and not recognizable by cross-sectional examination through an optical microscope of 1,000 magnifications.

A yet objective of the present invention is to provide a laminate circuit board with a multi-layer circuit structure. The laminate circuit board of the present invention method comprises a substrate, a first circuit metal layer, a first nanometer plating layer, a second circuit metal layer, a second nanometer plating layer and a cover layer. The first circuit metal layer is embedded in the substrate which has a smooth surface. The first circuit metal layer has a smooth upper surface flush with the upper surface of the substrate. The first nanometer plating layer is embedded in the substrate and encloses the first circuit metal layer except the upper surface which is covered by another nanometer plating layer. The second circuit metal layer is formed on the substrate opposite to the first circuit metal layer, and fills up at least one opening which is formed in the substrate with respect to the first circuit metal layer such that the second circuit metal layer electrically connects the first circuit metal layer. The second nanometer plating layer overlaps covers the second circuit metal layer. The cover layer is formed on the substrate to cover the nanometer plating layer above the first circuit metal layer, the substrate and the second nanometer plating layer. Each of the substrate, the first circuit metal layer, the second circuit metal layer, the first nanometer plating layer and the second nanometer plating layer has a smooth surface which has a roughness defined by Ra<0.35 µm and Rz<3 µm and not recognizable by cross-sectional examination through an optical microscope of 1,000 magnifications.

The above-mentioned first, second and third nanometer plating layers have a thickness of 5~30 nm and are made of at least two of copper, tin, aluminum, nickel, silver and gold.

The laminate circuit board of the present invention improves the junction adhesion between the nanometer plating layer and cover layer by chemical bonding. Further, the side effect resulting from reserved circuit width for compensation of the roughening of the circuit metal layer is also resolved. Since the surface of the laminate circuit board manufactured by the present invention is smooth and no additional circuit width is necessarily reserved for compensation, the density of the circuit increases and the structure for the multiple layer of circuit is accomplished by stacking.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
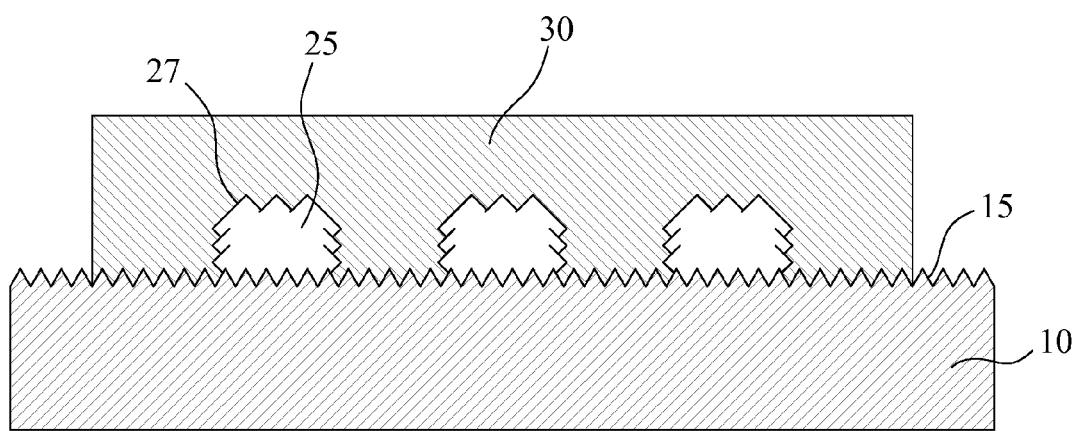
FIG. 1 shows a schematic diagram to illustrate the laminate circuit board with the multi-layer circuit structure in the prior arts.
Figure 2A:
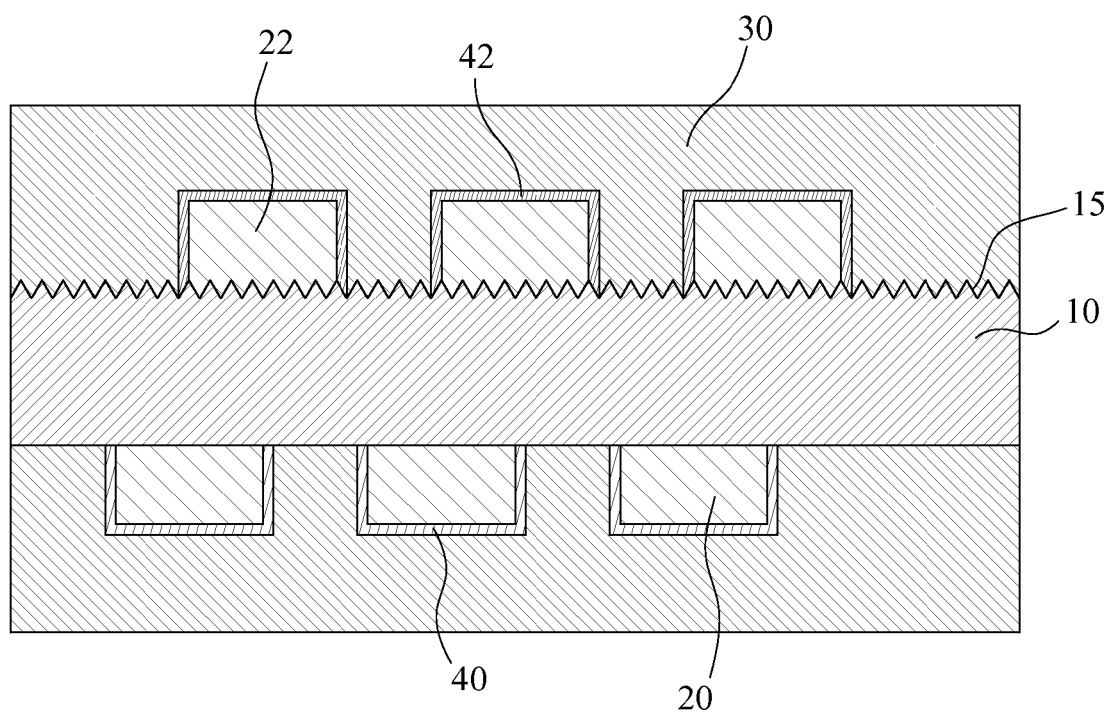
FIGS. 2A and 2B schematically show cross-sectional diagrams of the laminate circuit board with the multi-layer circuit structure according to the first and second embodiments of the present invention, respectively.

Please refer to FIG. 2A as the cross-sectional diagrams to schematically illustrate the laminate circuit board with the multi-layer circuit structure according to the first embodiment of the present invention. The laminate circuit board of the first embodiment comprises a substrate 10, a first circuit metal layer 20, a second circuit metal layer 22, a first nanometer plating layer 40, a second nanometer plating layer 42 and a cover layer 30. The first circuit metal layer 20 and the second circuit metal layer 22 are formed on the lower and upper surfaces of the substrate 10, respectively. The first nanometer plating layer 40 covers the first circuit metal layer 20, and the second nanometer plating layer 42 covers the second circuit metal layer 22. As can be seen from FIG. 2A, the first circuit metal layer 20 is enclosed between the first nanometer plating layer 40 and the lower surface of the substrate 10, and the second circuit metal layer 20 is enclosed between the first nanometer plating layer 40 and the upper surface of the substrate 10. The cover layer 30 is formed on the substrate 10 to cover the first nanometer plating layer 40 on the first circuit metal layer 20 and the second nanometer plating layer 42 on the second circuit metal layer 22. At least one of the upper and lower surfaces of the substrate 10 is smooth and each of the first circuit metal layer 20, the second circuit metal layer 22, the first nanometer plating layer 40 and the second nanometer plating layer 42 has a smooth surface. Each of the smooth surfaces of the substrate 10, the first circuit metal layer 20, the second circuit metal layer 22, the first nanometer plating layer 40 and the second nanometer plating layer 42 has a roughness defined by Ra (Arithmetical mean roughness)<0.35 μm and Rz (Ten-point mean roughness)<3 μm and not recognizable by cross-sectional examination through an optical microscope of 1,000 magnifications.

Figure 2B:
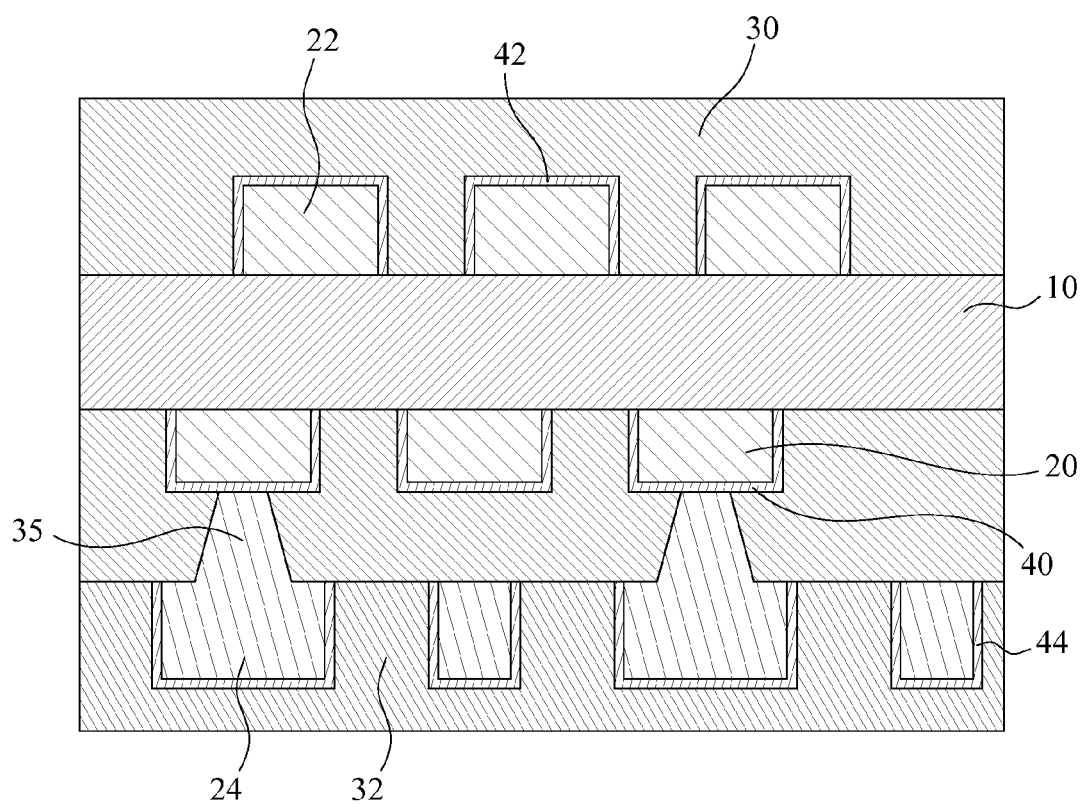

Refer to FIG. 2B. The laminate circuit board with the multi-layer circuit structure according to the second embodiment of the present invention comprises a substrate 10, a first circuit metal layer 20, a cover layer 30, a first nanometer plating layer 40, a third circuit metal layer 24, a third nanometer plating layer 44 and a second cover layer 32. The first circuit metal layer 20 is formed on one surface of the substrate 10 which is smooth. The first nanometer plating layer 40 covers the first circuit metal layer 20. The cover layer 30 is formed on the substrate 10 to cover the first nanometer plating layer 40 on the first circuit metal layer 20. The third circuit metal layer 24 is formed on the cover layer 30 and fills up at least one opening 35 in the cover layer 30 with respect to the first circuit metal layer 20 such that the third circuit metal layer 24 electrically connects the first circuit metal layer 20. The third nanometer plating layer 44 covers the third circuit metal layer 24 and the second cover layer 32 is formed on the cover layer 30 to cover the third nanometer plating layer 44 on the third circuit metal layer 24.

Additionally, the second circuit metal layer 22 and the second nanometer plating layer 42 covering the second circuit metal layer 22 can be formed on the other surface of the substrate 10 opposite to first circuit metal layer 20. The surfaces of the substrate 10, the first circuit metal layer 20, the second circuit metal layer 22, the third circuit metal layer 24, the first nanometer plating layer 40, the second nanometer plating layer 42 and the third nanometer plating layer 44 are smooth and have a roughness defined by Ra<0.35 μm and Rz<3 μm and not recognizable by cross-sectional examination through an optical microscope of 1,000 magnifications.

The substrate 10 is an insulation layer made of FR4 glass fiber or bismaleimide triazime resin. The first circuit metal layer 20, the second circuit metal layer 22 and the third circuit metal layer 24 are made of at least one of copper, aluminum, silver and gold. The first nanometer plating layer 40, the second nanometer plating layer 42 and the third nanometer plating layer 44 have a thickness of 5~40 nm and are made of at least two of copper, tin, aluminum, nickel, silver and gold. The cover layer 30 and the second cover layer 32 are made of the binder or the solder resist.

Figure 3A:
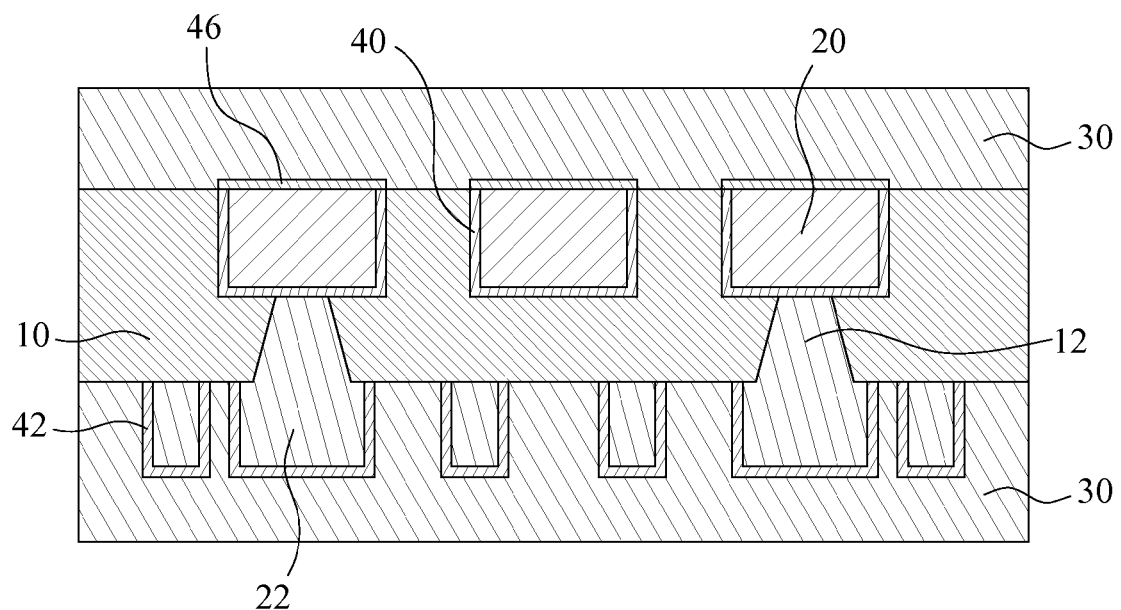
FIG. 3A schematically shows a cross-sectional diagram to illustrate the laminate circuit board with the multi-layer circuit structure according to the third embodiment of the present invention.

Further refer to FIG. 3A as the cross-sectional diagrams to illustrate the laminate circuit board with the multi-layer circuit structure according to the third embodiment of the present invention. The laminate circuit board of the third embodiment comprises a substrate 10, a first circuit metal layer 20, a second circuit metal layer 22, a first nanometer plating layer 40, a second nanometer plating layer 42 and a cover layer 30. The first circuit metal layer 20 is embedded in the substrate 10 and has an upper surface which is flush with the substrate 10. The first nanometer plating layer 40 is embedded in the substrate 10 and encloses the first circuit metal layer 20 except the upper surface. The second circuit metal layer 22 is formed on the substrate 10 opposite to the first circuit metal layer 20, and fills at least one opening 12 which is formed in the substrate 10 with respect to the first circuit metal layer 20 such that the second circuit metal layer 22 electrically connects the first circuit metal layer 20. The second nanometer plating layer 42 covers the second circuit metal layer 22. The cover layer 30 is formed on the substrate 10 to cover the substrate 10 and the second nanometer plating layer 42.

Figure 3B:
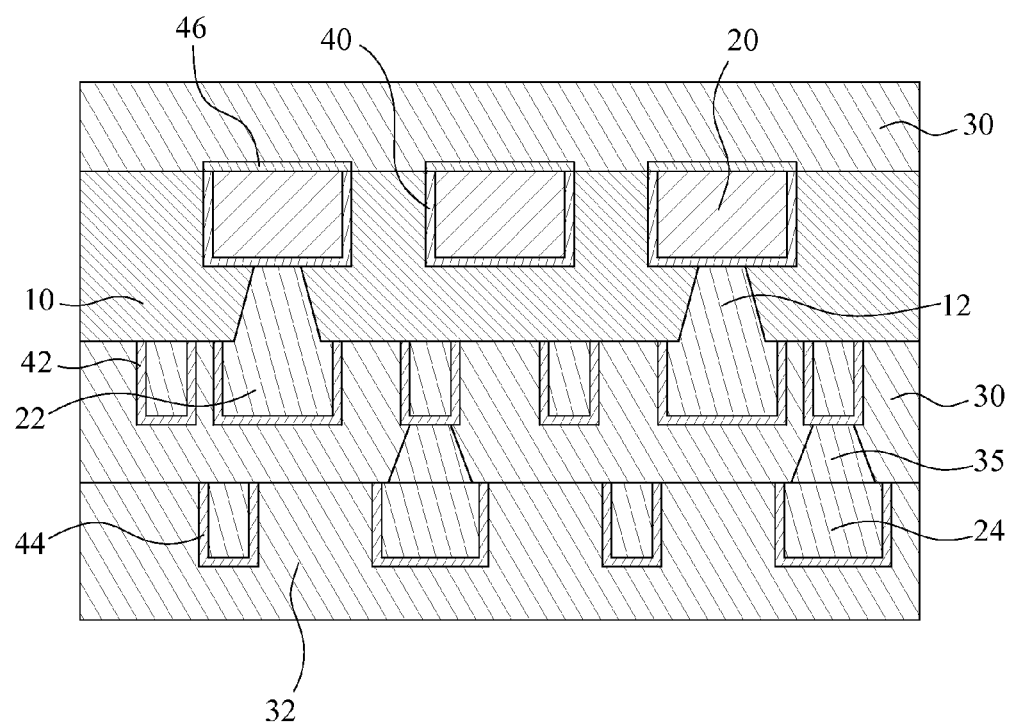
FIG. 3B schematically shows a cross-sectional diagram to illustrate the modification of the laminate circuit board with the multi-layer circuit structure according to the third embodiment of the present invention.

Additionally, a fourth nanometer plating layer 46 which is covered by the cover layer 30 is formed on the first circuit metal layer 20 exposed from the substrate 10. Moreover, please refer to FIG. 3B as a modification from the above third embodiment. Similar to the second embodiment, the third circuit metal layer 24 covered by the third nanometer plating layer 44 is formed on the cover layer 30 and fills up at least one opening 35 in the cover layer 30 with respect to the second circuit metal layer 22 so as to electrically connect the second circuit metal layer 22 via the second nanometer plating layer 42. The cover layer 32 is formed on the cover layer 30 to cover the third nanometer plating layer 44 which covers the third circuit metal layer 24.

Therefore, the surfaces of the substrate 10, the first circuit metal layer 20, the second circuit metal layer 22, the third circuit metal layer 24, the first nanometer plating layer 40, the second nanometer plating layer 42, the third nanometer plating layer 44 and the fourth nanometer plating layer 46 are smooth and has a roughness defined by $Ra<0.35$ μm and $Rz<3$ μm and not recognizable by cross-sectional examination through an optical microscope of 1,000 magnifications.

It should be noted that the number of the layers in the multi-layer circuit structure of the present invention shown here is only exemplarily illustrative and not limitative. Those who are skilled in the field of the arts can easily make modifications based on the present invention, which are intended to not depart from the scope of the present invention.

One feature of the laminate circuit board according to the present invention is to improve the junction adhesion by the chemical bonding between the nanometer plating layer and the cover layer or the substrate. It does not need to roughen the surface of the circuit metal layer for compensation of the circuit width and no reserved circuit width is required. Therefore, the side effect resulting from the reserved circuit width is eliminated because of the smooth surface of the laminate circuit board with the multi-layer circuit structure manufactured by the method according to the present invention such that much more dense circuit can be implemented in the substrate with the same area to form the multi-layer circuit structure.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A laminate circuit board with a multi-layer circuit structure, comprising:
    a substrate, one of upper and lower surfaces of the substrate is a smooth surface;
    a first circuit metal layer, formed on the lower surface of the substrate;
    a second circuit metal layer, formed on the upper surface of the substrate;
    a first nanometer plating layer having a thickness between 5 to 40 nm, covering the first circuit metal layer which is enclosed between the first nanometer plating layer and the substrate;
    a second nanometer plating layer having a thickness between 5 to 40 nm, covering the second circuit metal layer which is enclosed between the second nanometer plating layer and the substrate; and
    a cover layer, formed on the substrate to cover the first nanometer plating layer on the first circuit metal layer and the second nanometer plating layer on the second circuit metal layer,
    wherein each of the first circuit metal layer, the second circuit metal layer, the first nanometer plating layer and the second nanometer plating layer has a smooth surface which has a roughness defined by Ra (Arithmetical mean roughness)$<0.35$ μm and Rz (Ten-point mean roughness)$<3$ μm and not recognizable by cross-sectional examination through an optical microscope of 1,000 magnifications.

2. The laminate circuit board as claimed in claim 1, wherein the first circuit metal layer and the second circuit metal layer are made of at least one of copper, aluminum, silver and gold, the first nanometer plating layer and the second nanometer plating layer are made of at least two of copper, tin, aluminum, nickel, silver and gold, and the cover layer is made of a binder or a solder resist.

3. The laminate circuit board as claimed in claim 1, wherein the substrate is an insulation layer made of FR4 glass fiber or bismaleimide triazime resin.

4. A laminate circuit board with a multi-layer circuit structure, comprising:
    a substrate, having a surface which is smooth;
    a first circuit metal layer, formed on the surface of the substrate;
    a first nanometer plating layer having a thickness between 5 to 40 nm, covering the first circuit metal layer which is enclosed between the first nanometer plating layer and the substrate;
    a first cover layer, formed on the substrate to cover the substrate and the first nanometer plating layer on the first circuit metal layer;
    a second circuit metal layer, formed on the first cover layer and filling up at least one opening in the first cover layer with respect to the first circuit metal layer so as to electrically connect the second circuit metal layer and the first circuit metal layer;
    a second nanometer plating layer having a thickness between 5 to 40 nm, covering the second circuit metal layer; and
    a second cover layer, formed on the first cover layer to cover the second nanometer plating layer,
    wherein each of the first circuit metal layer, the second circuit metal layer, the first nanometer plating layer and the second nanometer plating layer has a smooth surface which has a roughness defined by $Ra<0.35$ μm and $Rz<3$ μm and not recognizable by cross-sectional examination through an optical microscope of 1,000 magnifications.

5. The laminate circuit board as claimed in claim 4, further comprising a third circuit metal layer formed on another surface of the substrate opposite to the surface on which the first circuit metal layer is formed, and a third nanometer plating layer covering the third circuit metal layer, wherein the third circuit metal layer and the third nanometer plating layer are covered by the first cover layer.

6. The laminate circuit board as claimed in claim 4, wherein the first circuit metal layer and the second circuit metal layer are made of at least one of copper, aluminum, silver and gold, the first nanometer plating layer and the second nanometer plating layer are made of at least two of copper, tin, aluminum, nickel, silver and gold, and the first cover layer and the second cover layer are made of a binder or a solder resist.

7. The laminate circuit board as claimed in claim 5, wherein the third circuit metal layer is made of at least one of copper, aluminum, silver and gold, and the third nanometer plating layer is made of at least two of copper, tin, aluminum, nickel, silver and gold, and has a thickness of 5~40 nm.

8. The laminate circuit board as claimed in claim 4, wherein the substrate is an insulation layer made of FR4 glass fiber or bismaleimide triazime resin.

9. A laminate circuit board with a multi-layer circuit structure, comprising:
  a substrate;
  a first circuit metal layer, embedded in the substrate and having an upper surface which is flush with a smooth surface of the substrate;
  a first nanometer plating layer having a thickness between 5 to 40 nm, embedded in the substrate under the first circuit metal layer and enclosing a bottom portion of the first circuit metal layer;
  a second circuit metal layer, formed on the substrate opposite to the smooth surface of the substrate, and the second circuit metal layer filling up at least one opening which is formed in the substrate with respect to the first circuit metal layer to electrically connect with the first circuit metal layer;
  a second nanometer plating layer having a thickness between 5 to 40 nm, covering the second circuit metal layer; and
  a first cover layer, formed on the substrate to cover the second nanometer plating layer;
  wherein each of the substrate, the first circuit metal layer, the second circuit metal layer, the first nanometer plating layer and the second nanometer plating layer has a smooth surface which has a roughness defined by $Ra<0.35$ μm and $Rz<3$ μm and not recognizable by cross-sectional examination through an optical microscope of 1,000 magnifications.

10. The laminate circuit board as claimed in claim 9, further comprising a third circuit metal circuit layer, a third nanometer plating layer and a second cover layer, wherein the third circuit metal layer is formed on the first cover layer covering the second nanometer plating layer and fills up at least one opening formed in the first cover layer with respect to the second nanometer plating layer so as to electrically connect the second nanometer plating layer, the third nanometer plating layer is formed on the third circuit metal circuit layer, and the second cover layer is formed on the first cover layer and the third nanometer plating layer.

11. The laminate circuit board as claimed in claim 9, wherein the first circuit metal layer and second circuit metal layer are made of at least one of copper, aluminum, silver and gold, the first nanometer plating layer and the second nanometer plating layer are made of at least two of copper, tin, aluminum, nickel, silver and gold, and the first cover layer is made of a binder or a solder resist.

12. The laminate circuit board as claimed in claim 10, wherein the third circuit metal layer is made of at least one of copper, aluminum, silver and gold, the third nanometer plating layer is made of at least two of copper, tin, aluminum, nickel, silver and gold, and has a thickness of 5~40 nm, and the second cover layer is made of a binder or a solder resist.

13. The laminate circuit board as claimed in claim 9, wherein the substrate is an insulation layer made of FR4 glass fiber or bismaleimide triazime resin.

14. The laminate circuit board as claimed in claim 9, further comprising a fourth nanometer plating layer which is formed on the upper surface of the first circuit metal layer, and has a smooth surface with a thickness of 5~40 nm, and wherein the first cover layer is also formed to cover the fourth nanometer plating layer which is made of at least two of copper, tin, aluminum, nickel, silver and gold.

* * * * *